United States Patent
Choi

(10) Patent No.: US 9,459,638 B2
(45) Date of Patent: Oct. 4, 2016

(54) INTERNAL VOLTAGE GENERATION CIRCUIT FOR ADJUSTING INTERNAL VOLTAGE SIGNAL BASED ON RECEIVED BULK VOLTAGE SIGNAL, AN UPPER LIMIT REFERENCE VOLTAGE SIGNAL, AND A LOWER LIMIT REFERENCE VOLTAGE SIGNAL

(71) Applicant: SK hynix Inc., Icheon-si, Gyeonggi-do (KR)

(72) Inventor: Young Kyoung Choi, Suwon-si (KR)

(73) Assignee: SK hynix Inc., Icheon-si (KR)

( * ) Notice: Subject to any disclaimer, the term of this patent is extended or adjusted under 35 U.S.C. 154(b) by 393 days.

(21) Appl. No.: 14/175,505

(22) Filed: Feb. 7, 2014

(65) Prior Publication Data
US 2015/0095668 A1   Apr. 2, 2015

(30) Foreign Application Priority Data
Sep. 30, 2013 (KR) .......... 10-2013-0116211

(51) Int. Cl.
| | |
|---|---|
| G06F 1/00 | (2006.01) |
| G05F 1/56 | (2006.01) |
| G11C 7/12 | (2006.01) |
| G11C 29/02 | (2006.01) |
| G11C 5/14 | (2006.01) |
| G06F 1/26 | (2006.01) |
| G05F 1/46 | (2006.01) |

(52) U.S. Cl.
CPC ............. G05F 1/56 (2013.01); G05F 1/465 (2013.01); G06F 1/26 (2013.01); G11C 5/147 (2013.01); G11C 7/12 (2013.01); G11C 29/021 (2013.01)

(58) Field of Classification Search
CPC ....... G11C 5/147; G11C 29/021; G11C 7/12; G05F 1/465; G05F 1/56; G05F 1/26
See application file for complete search history.

(56) References Cited

U.S. PATENT DOCUMENTS

| | | | | |
|---|---|---|---|---|
| 7,606,099 B2 * | 10/2009 | Chung | ............... | G11C 7/04 365/189.09 |
| 2006/0232302 A1 * | 10/2006 | Lee | ............... | G11C 5/147 327/1 |
| 2007/0069710 A1 * | 3/2007 | Lee | ............... | G05F 3/242 323/313 |
| 2007/0280008 A1 * | 12/2007 | Byeon | ............... | G11C 5/14 365/189.09 |
| 2011/0304384 A1 * | 12/2011 | Jeong | ............... | G11C 5/147 327/530 |
| 2012/0218006 A1 * | 8/2012 | Lee | ............... | G11C 5/147 327/108 |
| 2013/0027123 A1 | 1/2013 | Idgunji et al. | | |

FOREIGN PATENT DOCUMENTS

KR   1020120003242 A   1/2012

\* cited by examiner

*Primary Examiner* — Thomas Lee
*Assistant Examiner* — Zhipeng Wang
(74) *Attorney, Agent, or Firm* — William Park & Associates Ltd.

(57) ABSTRACT

An internal voltage generation circuit includes a bulk voltage generator and an internal voltage driver. The A bulk voltage generator is configured to output any one of a power supply voltage signal and a core voltage signal as a first bulk voltage signal and any one of a ground voltage signal and a low voltage signal as a second bulk voltage signal. An internal voltage driver receives the first and second bulk voltage signals to pull down an internal voltage signal when a level of the internal voltage signal is higher than a level of an upper limit reference voltage signal and to pull up the internal voltage signal when a level of the internal voltage signal is lower than a level of a lower limit reference voltage signal.

9 Claims, 6 Drawing Sheets

INTERNAL VOLTAGE GENERATION CIRCUIT FOR ADJUSTING INTERNAL VOLTAGE SIGNAL BASED ON RECEIVED BULK VOLTAGE SIGNAL, AN UPPER LIMIT REFERENCE VOLTAGE SIGNAL, AND A LOWER LIMIT REFERENCE VOLTAGE SIGNAL

CROSS-REFERENCE TO RELATED APPLICATION

The present application claims priority under 35 U.S.C 119(a) to Korean Application No. 10-2013-0116211, filed on Sep. 30, 2013, in the Korean Intellectual Property Office, which is incorporated herein by reference in its entirety as set forth in full.

BACKGROUND

1. Technical Field

Embodiments of the present disclosure relate to semiconductor integrated circuits and, more particularly, to internal voltage generation circuits.

2. Related Art

In general, semiconductor devices receive a power supply voltage signal VDD and a ground voltage signal VSS from an external system to generate internal voltage signals used in operations of internal circuits constituting each of the semiconductor devices. The internal voltage signals for operating the internal circuits of the semiconductor devices may include a core voltage signal VCORE supplied to a memory core region, a high voltage signal VPP (also, referred to as a boost voltage signal) used to drive or overdrive word lines, and a low voltage signal VBB (also, referred to as a back-bias voltage signal) applied to a bulk region (or a substrate) of NMOS transistors in the memory core region.

The core voltage signal VCORE may have a positive voltage which is lower than the power supply voltage signal VDD supplied from the external system. Thus, the core voltage signal VCORE may be obtained by lowering a level of the power supply voltage signal VDD to a certain level. In contrast, the high voltage signal VPP may have a level which is higher than a level of the power supply voltage signal VDD, and the low voltage signal VBB may have a negative voltage which is lower than the ground voltage signal VSS. Thus, charge pump circuits may be required to generate the high voltage signal VPP and the low voltage signal VBB.

SUMMARY

Various embodiments are directed to internal voltage generation circuits.

According to various embodiments, an internal voltage generation circuit includes a bulk voltage generator and an internal voltage driver. The bulk voltage generator is suitable to output any one of a power supply voltage signal and a core voltage signal as a first bulk voltage signal and any one of a ground voltage signal and a low voltage signal as a second bulk voltage signal. The internal voltage driver is suitable for receiving the first and second bulk voltage signals to pull down an internal voltage signal when a level of the internal voltage signal is higher than a level of an upper limit reference voltage signal and to pull up the internal voltage signal when a level of the internal voltage signal is lower than a level of a lower limit reference voltage signal.

According to various embodiments, an internal voltage generation circuit includes a bulk voltage generator, a reference voltage generator, and an internal voltage driver. The bulk voltage generator is suitable to output any one of a power supply voltage signal and a core voltage signal as a first bulk voltage signal and any one of a ground voltage signal and a low voltage signal as a second bulk voltage signal. The reference voltage generator is suitable for generating an upper limit reference voltage signal and a lower limit reference voltage signal. A first level voltage signal is obtained by lowering a level of the core voltage signal, and a second level voltage signal is obtained by boosting a level of the ground voltage signal. The internal voltage driver is suitable for receiving the first and second bulk voltage signals to pull down an internal voltage signal when a level of the internal voltage signal is higher than a level of the upper limit reference voltage signal and to pull up the internal voltage signal when a level of the internal voltage signal is lower than a level of the lower limit reference voltage signal.

According to various embodiments, the internal voltage generation circuit wherein the drive unit is configured to receive the first bulk voltage signal and the second bulk voltage signal to adjust threshold voltages of the pull-up element and the pull-down element.

According to various embodiments, the internal voltage generation circuit, wherein the first bulk voltage signal is applied to the pull-up element to decrease a threshold voltage of the pull-up element, and the second bulk voltage signal is applied to the pull-down element to decrease a threshold voltage of the pull-down element.

According to an embodiment of the present invention, a system comprises: a processor; a controller configured to receive a request and a data from the processor; and a memory unit configured to receive the request and the data from the controller, wherein the memory unit includes: a bulk voltage generator suitable to output any one of a power supply voltage signal and a core voltage signal as a first bulk voltage signal and any one of a ground voltage signal and a low voltage signal as a second bulk voltage signal; and an internal voltage driver suitable for receiving the first bulk voltage signal and the second bulk voltage signal to pull down an internal voltage signal when a level of the internal voltage signal is higher than a level of an upper limit reference voltage signal and to pull up the internal voltage signal when a level of the internal voltage signal is lower than a level of a lower limit reference voltage signal.

BRIEF DESCRIPTION OF THE DRAWINGS

Embodiments of the present invention will become more apparent in view of the attached drawings and accompanying detailed descriptions, in which.

DETAILED DESCRIPTION

Various embodiments of the present invention will be described hereinafter with reference to the accompanying drawings. However, the embodiments described herein are for illustrative purposes only and are not intended to limit the scope of the present invention.

Figure 1:
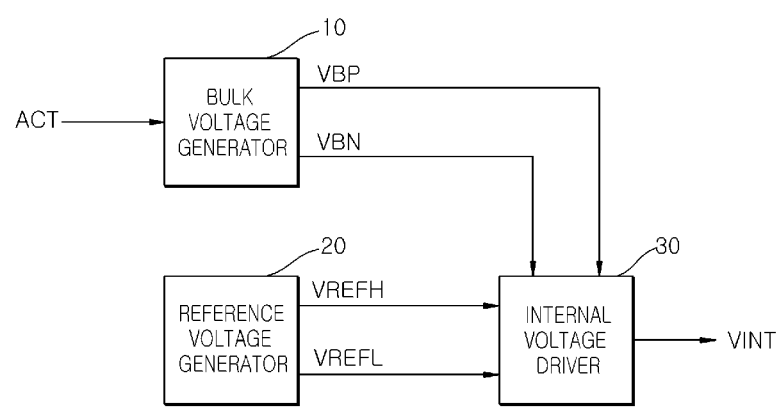
FIG. 1 is a block diagram illustrating an internal voltage generation circuit according to an embodiment of the present invention.

Referring to FIG. 1, an internal voltage generation circuit according to an embodiment may include a bulk voltage generator 10, a reference voltage generator 20 and an internal voltage driver 30.

The bulk voltage generator 10 may output any one of a power supply voltage signal VDD and a core voltage signal VCORE as a first bulk voltage signal VBP according to a level of an active signal ACT enabled in an active mode. Further, the bulk voltage generator 10 may output any one of a ground voltage signal VSS and a low voltage signal VBB as a second bulk voltage signal VBN according to a level of the active signal ACT enabled in the active mode. The core voltage signal VCORE may be obtained by lowering a level of the power supply voltage signal VDD supplied from an external system, and the low voltage signal VBB may be obtained by lowering a level of the ground voltage signal VSS supplied from the external system.

The reference voltage generator 20 may generate an upper limit reference voltage signal VREFH and a lower limit reference voltage signal VREFL which are divided by a plurality of resistors that are coupled in series between a first level voltage signal LEV1 terminal and a second level voltage signal LEV2 terminal. The first level voltage signal LEV1 may be obtained by lowering a level of the core voltage signal VCORE to a predetermined level; and the second level voltage signal LEV2 may be obtained by boosting a level of the ground voltage signal VSS to another predetermined level. A level of the upper limit reference voltage signal VREFH may be set to be higher than a level of the lower limit reference voltage signal VREFL.

The internal voltage driver 30 may receive the first bulk voltage signal VBP and the second bulk voltage signal VBN to pull down an internal voltage signal VINT when a level of the internal voltage signal VINT is higher than a level of the upper limit reference voltage signal VREFH; and to pull up the internal voltage signal VINT when a level of the internal voltage signal VINT is lower than a level of the lower limit reference voltage signal VREFL. The internal voltage driver 30 does not drive the internal voltage signal VINT when a level of the internal voltage signal VINT is lower than a level of the upper limit reference voltage signal VREFH and is higher than a level of the lower limit reference voltage signal VREFL. Accordingly, the internal voltage driver 30 may be configured to maintain a level of the internal voltage signal VINT without driving the internal voltage signal VINT when a level of the internal voltage signal VINT is higher than a level of the lower limit reference voltage signal VREFL and is lower than a level of the upper limit reference voltage signal VREFH.

A configuration of the bulk voltage generator 10 will be described more fully hereinafter with reference to FIG. 2.

Figure 2:
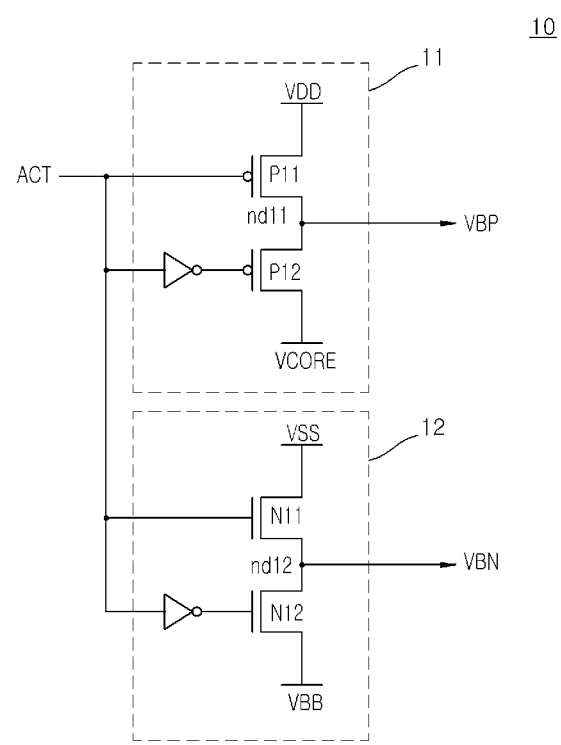
FIG. 2 is a circuit diagram illustrating a bulk voltage generator included in the internal voltage generation circuit of FIG. 1.

Referring to FIG. 2, the bulk voltage generator 10 may include a first switch unit 11 and a second switch unit 12.

The first switch unit 11 may include a PMOS transistor P11 coupled between a power supply voltage signal VDD terminal and a node ND11 and a PMOS transistor P12 coupled between the node ND11 and a core voltage signal VCORE terminal. The PMOS transistor P11 may be turned on to output the first bulk voltage signal VBP driven to have the power supply voltage signal VDD through the node ND11 when the active signal ACT is disabled to have a logic "low" level in a standby mode. The PMOS transistor P12 may be turned on to output the first bulk voltage signal VBP driven to have the core voltage signal VCORE through the node ND11 when the active signal ACT is enabled to have a logic "high" level in the active mode. That is, the first switch unit 11 may output the core voltage signal VCORE as the first bulk voltage signal VBP in the active mode and may output the power supply voltage signal VDD as the first bulk voltage signal VBP in the standby mode.

The second switch unit 12 may include an NMOS transistor N11 coupled between a ground voltage signal VSS terminal and a node ND12 and an NMOS transistor N12 coupled between the node ND12 and a low voltage signal VBB terminal. The NMOS transistor N11 may be turned on to output the second bulk voltage signal VBN driven to have the ground voltage signal VSS through the node ND12 when the active signal ACT is enabled to have a logic "high" level in the active mode. The NMOS transistor N12 may be turned on to output the second bulk voltage signal VBN driven to have the low voltage signal VBB through the node ND12 when the active signal ACT is disabled to have a logic "low" level in the standby mode. That is, the second switch unit 12 may output the ground voltage signal VSS as the second bulk voltage signal VBN in the active mode and may output the low voltage signal VBB as the second bulk voltage signal VBN in the standby mode.

A configuration of the reference voltage generator 20 will be described more fully hereinafter with reference to FIG. 3.

Figure 3:
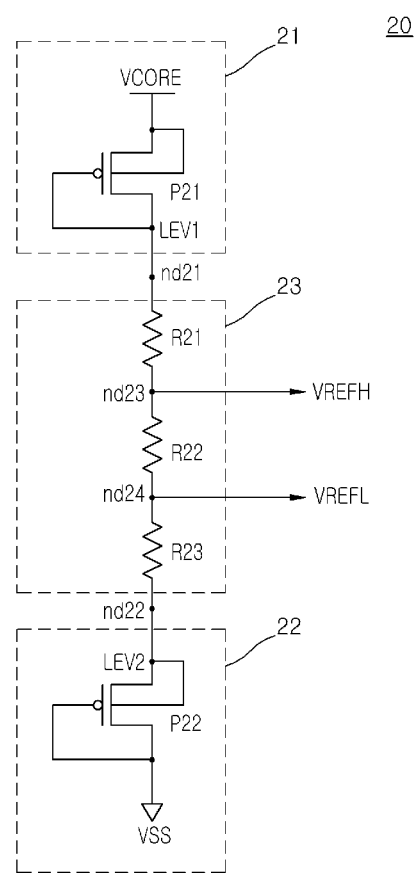
FIG. 3 is a circuit diagram illustrating a reference voltage generator included in the internal voltage generation circuit of FIG. 1.

Referring to FIG. 3, the reference voltage generator 20 may include a first level controller 21, a second level controller 22 and a voltage divider 23.

The first level controller 21 may include a PMOS transistor-type diode P21 coupled between the core voltage signal VCORE terminal and a node ND21. The core voltage signal VCORE may be applied to a bulk region of the PMOS transistor-type diode P21 to act as a back-bias voltage signal, and a gate of the PMOS transistor-type diode P21 may be coupled to the node ND21. That is, the first level controller 21 may drive the node ND21 to have a first level voltage signal LEV1 that has a predetermined level which is lower than a level of the core voltage signal VCORE. In various embodiments, the PMOS transistor-type diode P21 may be replaced with an NMOS transistor-type diode that lowers a level of the core voltage signal VCORE to generate the first level voltage signal LEV1.

The second level controller 22 may include a PMOS transistor-type diode P22 coupled between a node ND22 and the ground voltage signal VSS terminal. A voltage signal of the node ND22 may be applied to a bulk region of the PMOS transistor-type diode P22 to act as a back-bias voltage signal, and a gate of the PMOS transistor-type diode P22 may be coupled to the ground voltage signal VSS terminal. That is, the second level controller 22 may drive the node ND22 to have a second level voltage signal LEV2 that has another predetermined level which is higher than a level of the ground voltage signal VSS. In various embodiments, the PMOS transistor-type diode P22 may be replaced with an NMOS transistor-type diode that boosts a level of the ground voltage signal VSS to generate the second level voltage signal LEV2.

The voltage divider 23 may include a resistor R21 coupled between the node ND21 and a node ND23, a resistor R22 coupled between the node ND23 and a node ND24, and a resistor R23 coupled between the node ND24 and the node ND22. The voltage divider may include a plurality of resistors described above that are coupled in series between the node ND21 and the node ND23. The resistor R21 may lower a level of the first level voltage signal LEV1 to output the upper limit reference voltage signal VREFH through the node ND23. The resistor R22 may lower a level of the upper limit reference voltage signal VREFH to output the lower limit reference voltage signal VREFL through the node ND24. That is, the voltage divider 23 may divide a voltage difference between the first and second level voltage signals LEV1 and LEV2 using the plurality of resistors R21, R22 and R23 to generate the upper limit reference voltage signal VREFH and the lower limit reference voltage signal VREFL. The upper limit reference voltage signal VREFH and the lower limit reference voltage signal VREFL may be generated to have voltage levels between a level of the first level voltage signal LEV1 and a level of the second level voltage signal LEV2.

In various embodiments, the number of the resistors constituting the voltage divider 23 may be reduced or the resistors constituting the voltage divider 23 may be replaced with transistor-type diodes. In such a case, power consumption of the reference voltage generator 20 may be reduced.

A configuration of the internal voltage driver 30 will be described more fully hereinafter with reference to FIG. 4.

Figure 4:
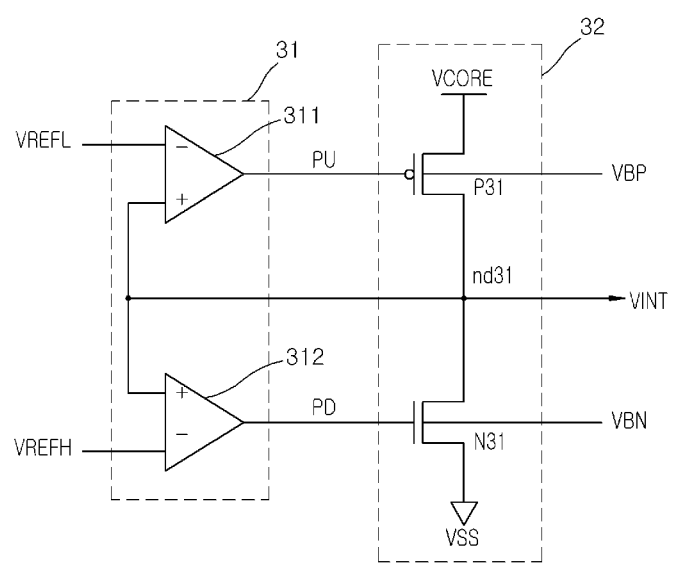
FIG. 4 is a circuit diagram illustrating an internal voltage driver included in the internal voltage generation circuit of FIG. 1.
Figure 5:
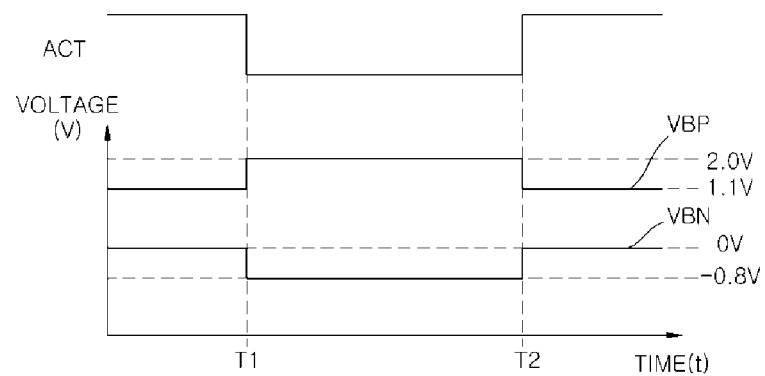
FIG. 5 is a timing diagram illustrating an operation for controlling a back-bias voltage signal applied to a transistor for driving an internal voltage signal generated in an internal voltage generation circuit according to an embodiment of the present invention.

Referring to FIG. 4, the internal voltage driver 30 may include a comparison unit 31 and a drive unit 32.

The comparison unit 31 may include a first comparator 311 and a second comparator 312. The first comparator 311 may compare the internal voltage signal VINT with the lower limit reference voltage signal VREFL to generate a pull-up signal PU enabled to have a logic "low" level when a level of the internal voltage signal VINT is lower than a level of the lower limit reference voltage signal VREFL. The second comparator 312 may compare the internal voltage signal VINT with the upper limit reference voltage signal VREFH to generate a pull-down signal PD enabled to have a logic "high" level when a level of the internal voltage signal VINT is higher than a level of the upper limit reference voltage signal VREFH. That is, the comparison unit 31 may generate the pull-up signal PU having a logic "low" level when a level of the internal voltage signal VINT is lower than a level of the lower limit reference voltage signal VREFL; and may generate the pull-down signal PD having a logic "high" level when a level of the internal voltage signal VINT is higher than a level of the upper limit reference voltage signal VREFH. Further, the comparison unit 31 may generate the pull-up signal PU having a logic "high" level and the pull-down signal PD having a logic "low" level when a level of the internal voltage signal VINT is higher than a level of the lower limit reference voltage signal VREFL and is lower than a level of the upper limit reference voltage signal VREFH.

The drive unit 32 may include a pull-up element P31 (e.g., a PMOS transistor) coupled between the core voltage signal VCORE terminal and a node ND31 and a pull-down element N31 (e.g., an NMOS transistor) coupled between the node ND31 and the ground voltage signal VSS terminal. The first bulk voltage signal VBP may be applied to a bulk region of the pull-up element P31 to act as a back-bias voltage signal, and the pull-up element P31 may be turned on to pull up the node ND31 when the pull-up signal PU is enabled to have a logic "low" level. The second bulk voltage signal VBN may be applied to a bulk region of the pull-down element N31 to act as a back-bias voltage signal, and the pull-down element N31 may be turned on to pull down the node ND31 when the pull-down signal PD is enabled to have a logic "high" level. That is, the drive unit 32 may receive the first and second bulk voltage signals VBP and VBN to adjust threshold voltages of the pull-up element P31 and the pull-down element N31. Further, the drive unit 32 may pull up the internal voltage signal VINT when the pull-up signal PU is enabled to have a logic "low" level and may pull down the internal voltage signal VINT when the pull-down signal PD is enabled to have a logic "high" level. The drive unit 32 does not drive the internal voltage signal VINT when the pull-up signal PU is disabled to have a logic "high" level and the pull-down signal PD is disabled to have a logic "low" level. When both the pull-up element P31 and the pull-down element N31 are turned off not to drive the internal voltage signal VINT, the internal voltage generation circuit may be referred to as being in a dead zone.

An operation of the internal voltage generation circuit having the aforementioned configuration will be described with reference to FIGS. 1 to 5 in conjunction with an example in which threshold voltages of the pull-up element P31 and the pull-down element N31 of the drive unit 32 are adjusted in the standby mode and an example in which threshold voltages of the pull-up element P31 and the pull-down element N31 of the drive unit 32 are adjusted in the active mode.

At a point of time "T1", the first switch unit 11 of the bulk voltage generator 10 may receive the active signal ACT having a logic "low" level for entering the standby mode to output the power supply voltage signal VDD as the first bulk voltage signal VBP. The second switch unit 12 may receive the active signal ACT having a logic "low" level to output the low voltage signal VBB as the second bulk voltage signal VBN. In various embodiments, the power supply voltage signal VDD may be set to have about 2.0 volts and the low voltage signal VBB may be set to have about −0.8 volts.

The first level controller 21 of the reference voltage generator 20 may drive the node ND21 to have the first level voltage signal LEV1 that has a predetermined level which is lower than a level of the core voltage signal VCORE. The second level controller 22 may drive the node ND22 to have the second level voltage signal LEV2 that has another predetermined level which is higher than a level of the ground voltage signal VSS. The voltage divider 23 may divide a voltage difference between the first and second level voltage signals LEV1 and LEV2 using the plurality of resistors R21, R22 and R23 coupled in series between the node ND21 and the node ND22 to generate the upper limit reference voltage signal VREFH and the lower limit reference voltage signal VREFL.

The comparison unit 31 may compare the internal voltage signal VINT with the lower limit reference voltage signal VREFL to generate the pull-up signal PU and may compare the internal voltage signal VINT with the upper limit reference voltage signal VREFH to generate the pull-down signal PD. The first bulk voltage signal VBP (having the power supply voltage signal VDD of about 2.0 volts) may be applied to a bulk region of the pull-up element P31 of the drive unit 32 to increase an absolute value of a threshold voltage of the pull-up element P31. The second bulk voltage signal VBN (having the low voltage signal VBB of about −0.8 volts) may be applied to a bulk region of the pull-down element N31 of the drive unit 32 to increase a threshold voltage of the pull-down element N31.

At a point of time "T2", the first switch unit 11 of the bulk voltage generator 10 may receive the active signal ACT having a logic "high" level for entering the active mode to output the core voltage signal VCORE as the first bulk voltage signal VBP. The second switch unit 12 may receive the active signal ACT having a logic "high" level to output the ground voltage signal VSS as the second bulk voltage signal VBN. In various embodiments, the core voltage signal VCORE may be set to have about 1.1 volts and the ground voltage signal VSS may be set to have about 0 volts.

The first level controller 21 of the reference voltage generator 20 may drive the node ND21 to have the first level voltage signal LEV1 that has a predetermined level which is lower than a level of the core voltage signal VCORE. The second level controller 22 may drive the node ND22 to have the second level voltage signal LEV2 that has another predetermined level which is higher than a level of the ground voltage signal VSS. The voltage divider 23 may divide a voltage difference between the first and second level voltage signals LEV1 and LEV2 using the plurality of resistors R21, R22 and R23 coupled in series between the node ND21 and the node ND22 to generate the upper limit reference voltage signal VREFH and the lower limit reference voltage signal VREFL.

The comparison unit 31 may compare the internal voltage signal VINT with the lower limit reference voltage signal VREFL to generate the pull-up signal PU and may compare the internal voltage signal VINT with the upper limit reference voltage signal VREFH to generate the pull-down signal PD. The first bulk voltage signal VBP (having the core voltage signal VCORE of about 1.1 volts) may be applied to a bulk region of the pull-up element P31 of the drive unit 32 to decrease an absolute value of a threshold voltage of the pull-up element P31 as compared with the standby mode. The second bulk voltage signal VBN (having the ground voltage signal VSS of about 0 volts) may be applied to a bulk region of the pull-down element N31 of the drive unit 32 to decrease a threshold voltage of the pull-down element N31 as compared with the standby mode.

Figure 6:
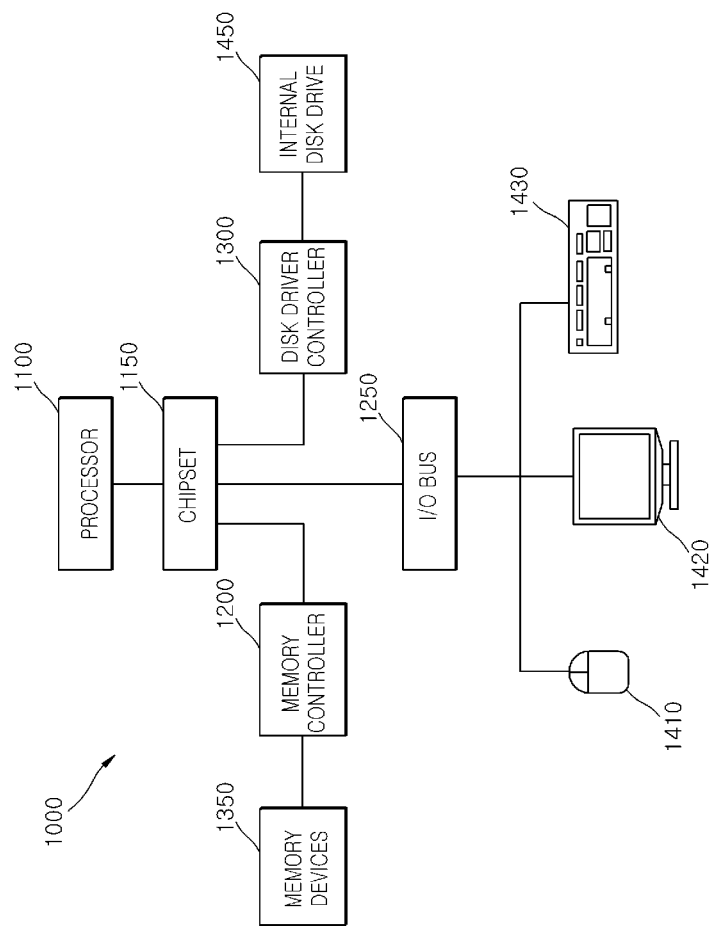
FIG. 6 illustrates a block diagram of a system employing a memory controller circuit in accordance with an embodiment of the present invention.

Referring to FIG. 6, a system 1000 may include one or more processors 1100. The processor 1100 may be used individually or in combination with other processors. A chipset 1150 may be operably coupled to the processor 1100. The chipset 1150 is a communication pathway for signals between the processor 1100 and other components of the system 1000, which may include a memory controller 1200, an input/output ("I/O") bus 1250, and a disk drive controller 1300. Depending on the configuration of the system, any one of a number of different signals may be transmitted through the chipset 1150.

The memory controller 1200 may be operably coupled to the chipset 1150. The memory controller 1200 can receive a request provided from the processor 1100 through the chipset 1150. The memory controller 1200 may be operably coupled to one or more memory devices 1350. The memory devices 1350 may include the internal voltage generation circuit described above.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430.

The I/O bus 1250 may employ any one of a number of communications protocols to communicate with the I/O devices 1410, 1420, and 1430.

The disk drive controller 1300 may also be operably coupled to the chipset 1150. The disk drive controller 1300 may serve as the communication pathway between the chipset 1150 and one or more internal disk drives 1450. The disk drive controller 1300 and the internal disk drives 1450 may communicate with each other or with the chipset 1150 using virtually any type of communication protocol, including all of those mentioned above with regard to the I/O bus 1250.

According to the embodiments described above, a power supply voltage signal may be used as a back-bias voltage signal of a pull-up element for pulling up an internal voltage signal to increase an absolute value of a threshold voltage of the pull-up element in the standby mode. Further, a low voltage signal may be used as a back-bias voltage signal of a pull-down element for pulling down the internal voltage signal to increase a threshold voltage of the pull-down element in the standby mode. Thus, leakage currents of the pull-up element and the pull-down element may be reduced to decrease power consumption of an internal voltage generation circuit including the pull-up element and the pull-down element in the standby mode.

What is claimed is:
1. An internal voltage generation circuit comprising:
   a bulk voltage generator suitable to output any one of a power supply voltage signal and a core voltage signal as a first bulk voltage signal and any one of a ground voltage signal and a low voltage signal as a second bulk voltage signal;
   a reference voltage generator suitable for generating an upper limit reference voltage signal and a lower limit reference voltage signal, a first level voltage signal being obtained by lowering a level of the core voltage signal and a second level voltage signal being obtained by boosting a level of the ground voltage signal; and
   an internal voltage driver suitable for receiving the first bulk voltage signal and the second bulk voltage signal to pull down an internal voltage signal when a level of the internal voltage signal is higher than a level of the upper limit reference voltage signal and to pull up the internal voltage signal when a level of the internal voltage signal is lower than a level of the lower limit reference voltage signal;
   wherein the reference voltage generator includes:
   a first level controller suitable for being coupled between a core voltage signal terminal and a first node and suitable for driving the first node to have the first level voltage signal generated from the core voltage signal;
   a second level controller suitable for being coupled between a second node and a ground voltage signal terminal and suitable for driving the second node to have the second level voltage signal generated from the ground voltage signal; and
   a voltage divider suitable for including a plurality of resistors being coupled in series between the first node and the second node and suitable for generating the upper limit reference voltage signal and the lower limit reference voltage signal;
   wherein the upper limit reference voltage signal and the lower limit reference voltage signal are generated to have voltage levels between a level of the first level voltage signal and a level of the second level voltage signal.

2. The internal voltage generation circuit of claim 1,
wherein the core voltage signal is obtained by lowering a level of the power supply voltage signal supplied from an external system; and
wherein the low voltage signal is obtained by lowering a level of the ground voltage signal supplied from the external system.

3. The internal voltage generation circuit of claim 1, wherein a level of the upper limit reference voltage signal is higher than a level of the lower limit reference voltage signal.

4. The internal voltage generation circuit of claim 1, wherein the internal voltage driver maintains a level of the internal voltage signal without driving the internal voltage signal when a level of the internal voltage signal is higher than a level of the lower limit reference voltage signal and is lower than a level of the upper limit reference voltage signal.

5. The internal voltage generation circuit of claim 1, wherein the bulk voltage generator includes:
a first switch unit suitable for outputting the core voltage signal as the first bulk voltage signal while the active signal is enabled and suitable for outputting the power supply voltage signal as the first bulk voltage signal while the active signal is disabled; and
a second switch unit suitable for outputting the ground voltage signal as the second bulk voltage signal while the active signal is enabled and suitable for outputting the low voltage signal as the second bulk voltage signal while the active signal is disabled.

6. The internal voltage generation circuit of claim 1, wherein the internal voltage driver includes:
a comparison unit suitable for comparing the internal voltage signal with the lower limit reference voltage signal to generate a pull-up signal and suitable for comparing the internal voltage signal with the upper limit reference voltage signal to generate a pull-down signal; and
a drive unit suitable for pulling up the internal voltage signal when the pull-up signal is enabled and suitable for pulling down the internal voltage signal when the pull-down signal is enabled.

7. The internal voltage generation circuit of claim 6, wherein the comparison unit includes:
a first comparator suitable for generating the pull-up signal enabled when a level of the internal voltage signal is lower than a level of the lower limit reference voltage signal; and
a second comparator suitable for generating the pull-down signal enabled when a level of the internal voltage signal is higher than a level of the upper limit reference voltage signal.

8. The internal voltage generation circuit of claim 6, wherein the drive unit includes:
a pull-up element suitable for receiving the first bulk voltage signal as a back-bias voltage signal thereof and suitable for being turned on in response to the pull-up signal to pull up the internal voltage signal; and
a pull-down element suitable for receiving the second bulk voltage signal as a back-bias voltage signal thereof and suitable for being turned on in response to the pull-down signal to pull down the internal voltage signal.

9. A system comprising:
a processor;
a controller configured to receive a request and a data from the processor; and
a memory unit configured to receive the request and the data from the controller,
wherein the memory unit comprises:
a bulk voltage generator suitable to output any one of a power supply voltage signal and a core voltage signal as a first bulk voltage signal and any one of a ground voltage signal and a low voltage signal as a second bulk voltage signal;
a reference voltage generator suitable for generating an upper limit reference voltage signal and a lower limit reference voltage signal, a first level voltage signal being obtained by lowering a level of the core voltage signal and a second level voltage signal being obtained by boosting a level of the ground voltage signal; and
an internal voltage driver suitable for receive the first bulk voltage signal and the second bulk voltage signal to pull down an internal voltage signal when a level of the internal voltage signal is higher than a level of an upper limit reference voltage signal and to pull up the internal voltage signal when a level of the internal voltage signal is lower than a level of a lower limit reference voltage signal,
wherein the reference voltage generator includes:
a first level controller suitable for being coupled between a core voltage signal terminal and a first node and suitable for driving the first node to have the first level voltage signal generated from the core voltage signal;
a second level controller suitable for being coupled between a second node and a ground voltage signal terminal and suitable for driving the second node to have the second level voltage signal generated from the ground voltage signal; and
a voltage divider suitable for including a plurality of resistors being coupled in series between the first node and the second node and suitable for generating the upper limit reference voltage signal and the lower limit reference voltage signal,
wherein the upper limit reference voltage signal and the lower limit reference voltage signal are generated to have voltage levels between a level of the first level voltage signal and a level of the second level voltage signal.

* * * * *